United States Patent
Chang et al.

(10) Patent No.: US 9,711,373 B2
(45) Date of Patent: Jul. 18, 2017

(54) METHOD OF FABRICATING A GATE DIELECTRIC FOR HIGH-K METAL GATE DEVICES

(75) Inventors: Che-Hao Chang, Hsinchu (TW);
Cheng-Hao Hou, Hsinchu (TW);
Chen-Hua Yu, Hsin-Chu (TW);
Tai-Bor Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1150 days.

(21) Appl. No.: 12/550,767

(22) Filed: Aug. 31, 2009

(65) Prior Publication Data

US 2010/0075507 A1    Mar. 25, 2010

Related U.S. Application Data

(60) Provisional application No. 61/099,137, filed on Sep. 22, 2008.

(51) Int. Cl.
*H01L 21/469*    (2006.01)
*H01L 21/316*    (2006.01)
(Continued)

(52) U.S. Cl.
CPC .... *H01L 21/31645* (2013.01); *C23C 16/0272* (2013.01); *C23C 16/308* (2013.01); *C23C 16/40* (2013.01); *C23C 16/45525* (2013.01); *H01L 21/28194* (2013.01); *H01L 21/28202* (2013.01); *H01L 21/3141* (2013.01);
(Continued)

(58) Field of Classification Search
CPC ......... H01L 21/28194; H01L 21/28202; H01L 21/3145; H01L 21/31645; H01L 21/3141; H01L 29/317; H01L 21/31641; H01L 21/3185; H01L 29/513; C23C 16/0272;
(Continued)

(56) References Cited

U.S. PATENT DOCUMENTS 5,248,636 A * 9/1993 Davis .................... C23C 16/482
                                                    216/63
5,451,542 A * 9/1995 Ashby ................... H01L 21/314
                                                    257/E21.266

(Continued)

FOREIGN PATENT DOCUMENTS

CN    101151717    2/2006
TW    200822980    6/2008

OTHER PUBLICATIONS

O'Connor In situ H2S passivation of In0.53Ga0.47As/InP metal-oxide-semiconductor capacitors with atomic-layer deposited HfO2 gate dielectric, Applied Physics Letters, 92, 2008, pp. 022902-1 to 022902-3 date: Jan. 14, 2008.*

(Continued)

*Primary Examiner* — Thinh T Nguyen
(74) *Attorney, Agent, or Firm* — Haynes and Boone, LLP

(57) ABSTRACT

The present disclosure provides a method of fabricating a semiconductor device. The method includes providing a substrate, forming an interfacial layer on the substrate by treating the substrate with radicals, and forming a high-k dielectric layer on the interfacial layer. The radicals are selected from the group consisting of hydrous radicals, nitrogen/hydrogen radicals, and sulfur/hydrogen radicals.

20 Claims, 12 Drawing Sheets

A,B = ALD precursors
A: Hf[NCH$_3$C$_2$H$_5$]$_4$, i.e., TEMAH
B: D$_2$O

A and B can be other ALD precursors different to TEMAH and D$_2$O

(51) Int. Cl.
| | |
|---|---|
| C23C 16/02 | (2006.01) |
| C23C 16/30 | (2006.01) |
| C23C 16/40 | (2006.01) |
| C23C 16/455 | (2006.01) |
| H01L 21/28 | (2006.01) |
| H01L 21/314 | (2006.01) |
| H01L 21/318 | (2006.01) |
| H01L 29/51 | (2006.01) |

(52) U.S. Cl.
CPC ...... *H01L 21/3145* (2013.01); *H01L 21/3185* (2013.01); *H01L 21/31641* (2013.01); *H01L 29/513* (2013.01); *H01L 29/517* (2013.01)

(58) Field of Classification Search
CPC .. C23C 16/308; C23C 16/40; C23C 16/45525
USPC .......... 707/640–654; 709/203; 438/761–763, 438/785, 791; 257/E21.266, E21.267, 257/E21.268, 411
See application file for complete search history.

(56) References Cited

U.S. PATENT DOCUMENTS

| | | | | |
|---|---|---|---|---|
| 5,616,947 | A | * | 4/1997 | Tamura ............. H01L 21/28264 257/289 |
| 6,020,458 | A | * | 2/2000 | Lee et al. ....................... 528/401 |
| 6,139,922 | A | * | 10/2000 | Kaloyeros et al. ............ 438/758 |
| 7,625,609 | B2 | * | 12/2009 | Matsuura ....................... 427/579 |
| 7,662,693 | B2 | * | 2/2010 | Bhattacharyya ............... 438/381 |
| 2002/0182385 | A1 | * | 12/2002 | Senkevich ............. B82Y 30/00 428/209 |
| 2004/0106261 | A1 | | 6/2004 | Huotari et al. |
| 2004/0154743 | A1 | * | 8/2004 | Savas et al. ................. 156/345.5 |
| 2005/0048218 | A1 | * | 3/2005 | Weidman ....................... 427/446 |
| 2005/0059259 | A1 | * | 3/2005 | O'Meara et al. .............. 438/765 |
| 2005/0104112 | A1 | | 5/2005 | Haukka et al. |
| 2006/0099782 | A1 | * | 5/2006 | Ritenour ............ H01L 21/28255 438/542 |
| 2006/0172474 | A1 | * | 8/2006 | Wajda et al. .................. 438/151 |
| 2006/0172498 | A1 | * | 8/2006 | Yamaguchi ........ H01L 21/28185 438/287 |
| 2006/0228898 | A1 | * | 10/2006 | Wajda et al. .................. 438/769 |
| 2006/0286812 | A1 | * | 12/2006 | Tao ........................ H01L 21/306 438/769 |
| 2007/0049055 | A1 | * | 3/2007 | Ramaswamy .......... C23C 16/34 438/785 |
| 2007/0093074 | A1 | * | 4/2007 | Frank ................. H01L 21/02046 438/778 |
| 2007/0123003 | A1 | * | 5/2007 | Brask ................. H01L 21/28008 438/478 |
| 2007/0161214 | A1 | * | 7/2007 | Fompeyrine ....... H01L 21/28158 438/483 |
| 2007/0190802 | A1 | * | 8/2007 | Aoyama et al. ............... 438/758 |
| 2008/0020593 | A1 | * | 1/2008 | Wang et al. ................... 438/782 |
| 2008/0048216 | A1 | * | 2/2008 | Ye ........................ H01L 29/517 257/288 |
| 2008/0254605 | A1 | | 10/2008 | Brunco et al. |
| 2008/0286697 | A1 | * | 11/2008 | Verhaverbeke et al. ....... 430/322 |
| 2009/0042344 | A1 | * | 2/2009 | Ye ..................... H01L 29/66462 438/172 |
| 2012/0256276 | A1 | * | 10/2012 | Hwang ........... H01L 21/823842 257/410 |

OTHER PUBLICATIONS

O'connor et al. web document "In situ H2S passivation of In0.53 Ga 0.47As/InP metal-oxide- semiconductor capacitors with atomic-layer deposited HfO2 gate dielectric" year 2008, American Institute of Physics.*

Chinese Patent Office, Office Action issued Sep. 17, 2010, Application No. 200910173269.9, 7 pages.

K. P. Bastos, et al., "Oxygen Reaction-Diffusion in Metalorganic Chemical Vapor Deposition HfO2 Films Annealed in O2," Applied Physics Letters, Aug. 26, 2002, vol. 81, No. 9, pp. 1669-1671.

Chi-Chun Chen, et al., "Extended Scaling of Ultrathin Gate Oxynitride Toward Sub-65nm CMOS by Optimization of UV Photo-Oxidation, Soft Plasma/Thermal Nitridation & Stress Enhancement," Symposium on VLSI Technology Digest of Technical Papers, 2004, pp. 176-177.

K. S. Finnie, et al., "Influence of Si (100) Surface Pretreatment on the Morphology of TiO2 Films Grown by Atomic Layer Deposition," Thin Solid Films, Elsevier Science B.V., 2003, pp. 109-116.

Atsuyuki Fukano, "Highly-Insulating Ultra-Thin SiO2 Film Grown by VUV Photo-Oxidation," Mat. Res. Soc. Symp. Proc. 2004, vol. 811, pp. E1.3.1-E1.3.6.

M. L. Green, et al., "Nucleation and Growth of Atomic Layer Deposited HfO2 Gate Dielectric Layers on Chemical Oxide (Si—O—H) and Thermal Oxide (SiO2 or Si—O—N) Underlayers," Journal of Applied Physics, Dec. 15, 2002, vol. 92, No. 12, pp. 7168-7174.

Hyunseok Kang, et al., "Effects of Remote Plasma Pre-Oxidation of Si Substrates on the Characteristics of ALD-Deposited HfO2 Gate Dielectrics," Electrochemical and Solid-State Letters, The Electrochemical Society, 2006, pp. G211-G214.

G. Lucovsky, "Ultrathin Nitrided Gate Dielectrics: Plasma Processing, Chemical Characterization, Performance and Reliability," IBM J. Res Develop., May 1999, vol. 43, No. 3, pp. 301-326.

Tetsuya Nishiguchi, et al., "Rapid Oxidation of Silicon Using UV-Light Irradiation in Low-Pressure, Highly Concentrated Ozone Gas Below 300 oC," The Japan Society of Applied Physics, 2007, vol. 46, No. 5A, pp. 2835-2839.

Injo Ok, et al., "Self-Aligned n- and p-channel GaAs MOSFETs on Undoped and P-typed Substrates Using HfO2 and Silicon Interface Passivation Layer," 4 pages.

C. J. Sandroff, et al., "Electronic Passivation of GaAs Surfaces Through the Formation of Arsenic-Sulfur Bonds," Appl. Phys. Lett. Jan. 1989, 4 pages.

T. Tiedje, et al., "We report photoemission studies of GaAs(100) surfaces treated with H2S. Our high-resolution core level photoemission data show that these surfaces are completely terminated by a GaSx species and the treated surface is stable in air or water. Thus a H2S treatment might result in better device quality surfaces and interfaces than the surfaces prepared by recently proposed chemical treatments involving Na2S or (NH4)2S, " J. Vac. Sci. Technol. B, vol. 7, No. 4, Jul./Aug. 1989, 4 pages.

W. Tsai, et al., "Comparison of sub 1 nm TiN/HfO2 with Poly-Si/ HfO2 Gate Stacks Using Scaled Chemical Oxide Interface," Symposium on VLSI Technology Digest of Technical Papers, 2003, pp. 21-22.

Y. Xuan, et al., "High Performance Submicron Inversion-Type Enhancement-Mode InGaAs MOSFETs with ALD A12O3, HfO2 and HfAlO as Gate Dielectrics," 2007 IEEE, pp. 637-640.

Taiwanese Patent Office, Office Action dated Oct. 15, 2012, Application No. 098131886, 7 pages.

Akasaka, Yasushki, et al., "Modified Oxygen Vacancy Induced Fermi Level Pinning Model Extendable to P-Metal Pinning," The Japan Society of Applied Physics, vol. 45, No. 49, 2006, pp. L12898-L1292.

U.S. Patent and Trademark Office, Office action dated Apr. 29, 2010, U.S. Appl. No. 12/339,990, 9 pages.

* cited by examiner

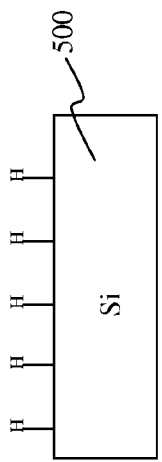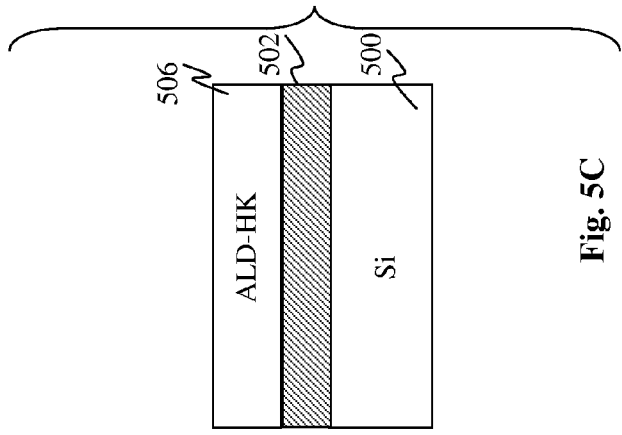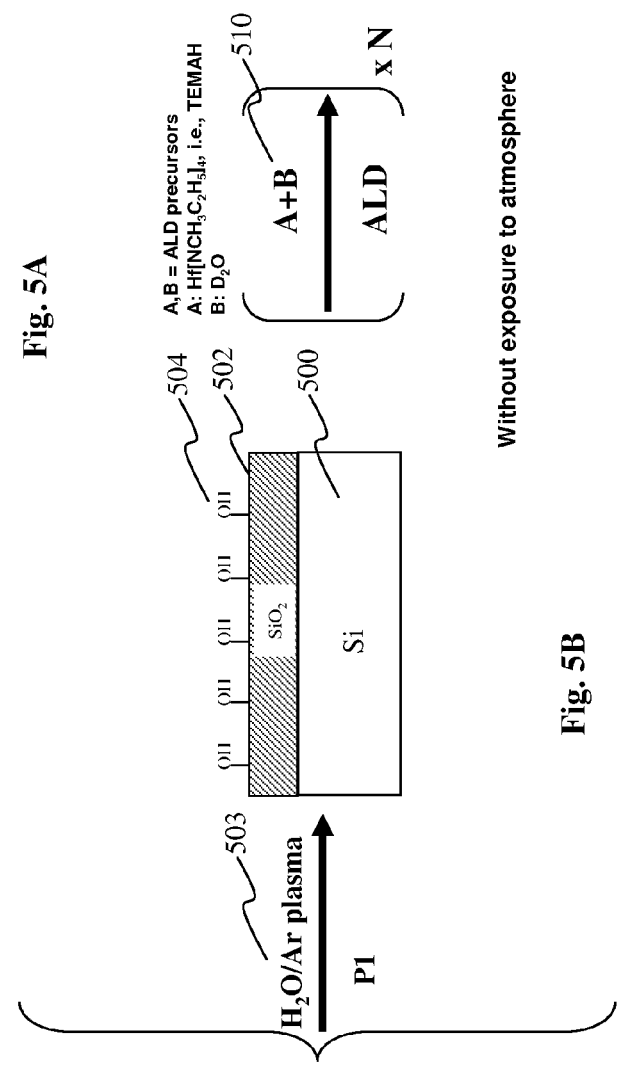
Fig. 5A
Fig. 5B
Fig. 5C

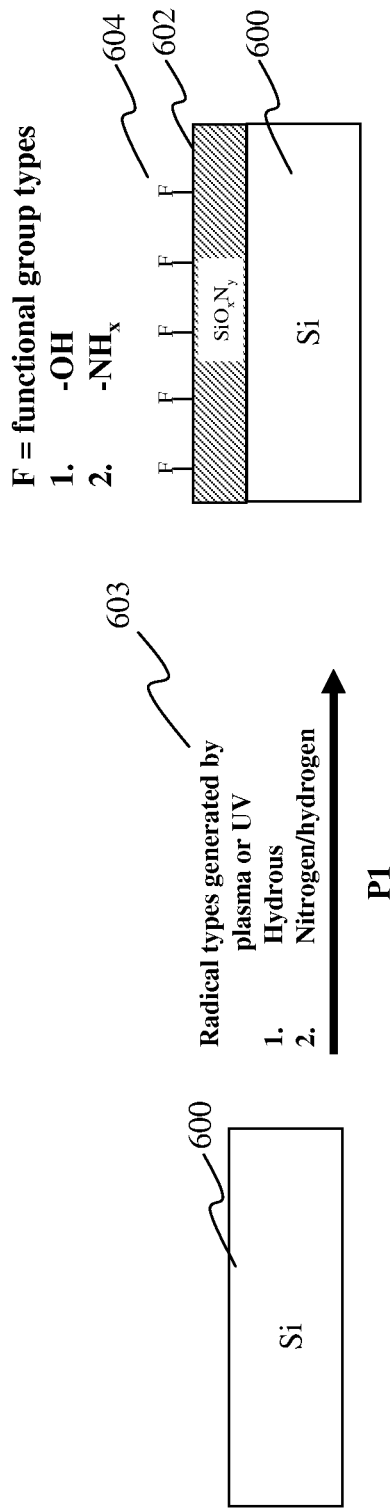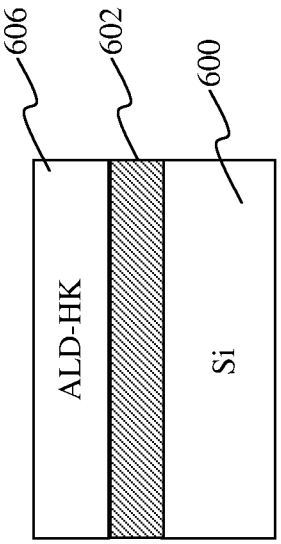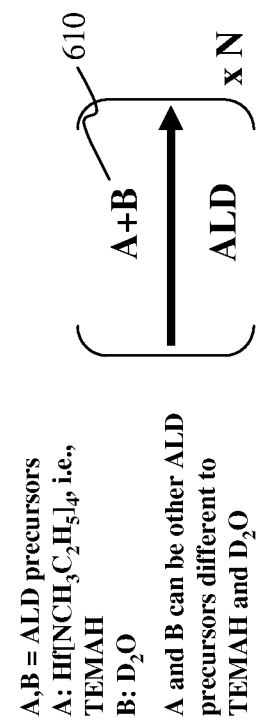

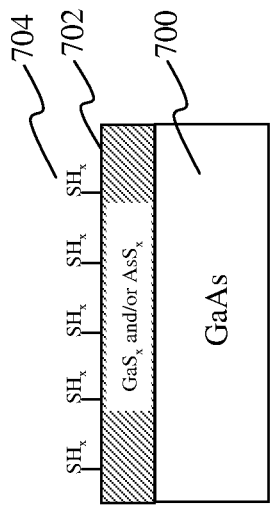
Fig. 7A
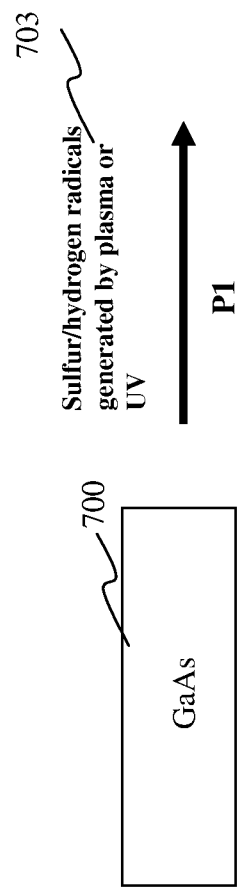
Fig. 7B
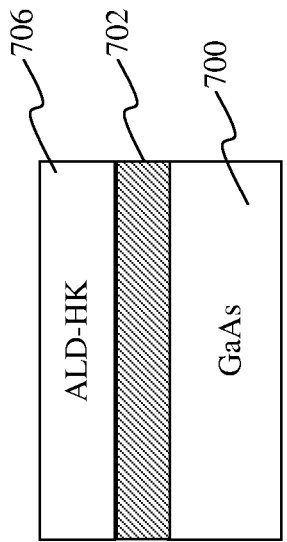
Fig. 7C
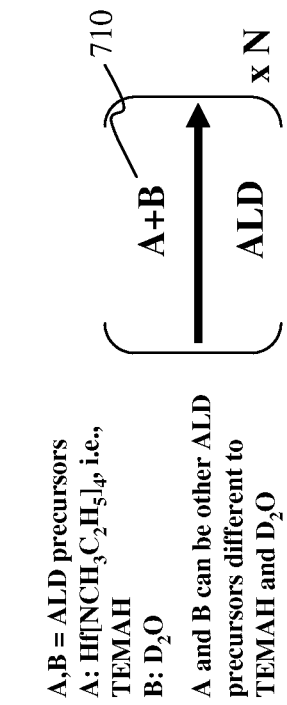
A,B = ALD precursors
A: Hf[NCH$_3$C$_2$H$_5$]$_4$, i.e., TEMAH
B: D$_2$O
A and B can be other ALD precursors different to TEMAH and D$_2$O

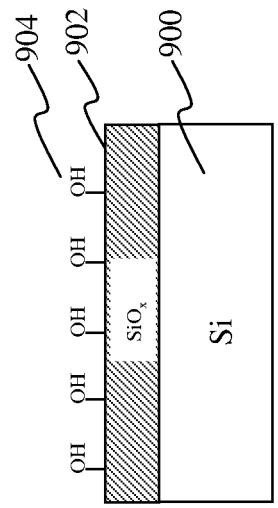
Fig. 9B
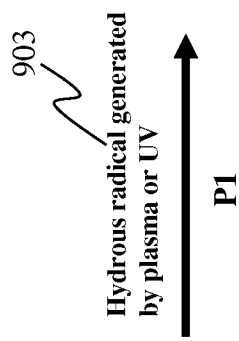
P1
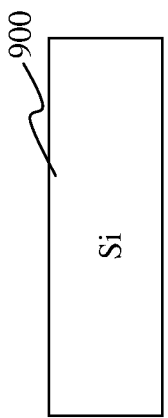
Fig. 9A

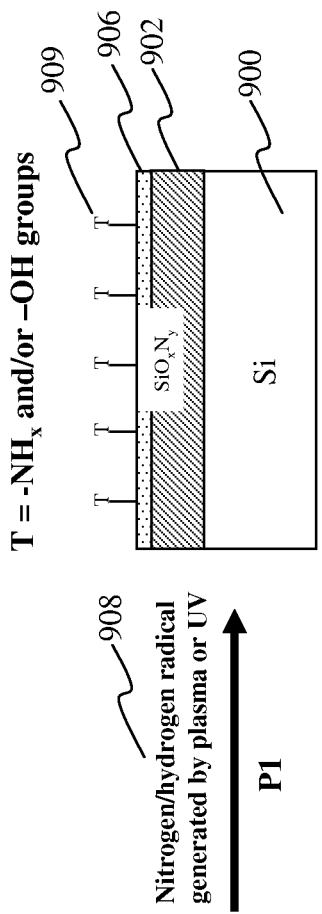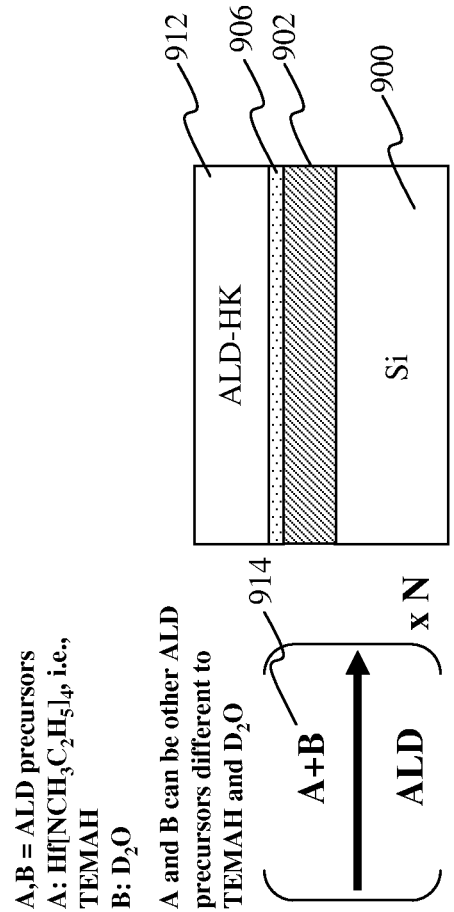

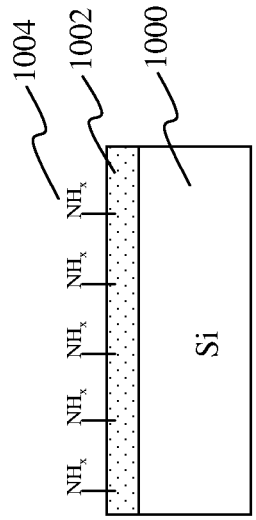
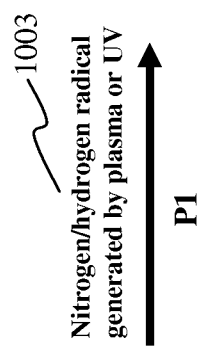
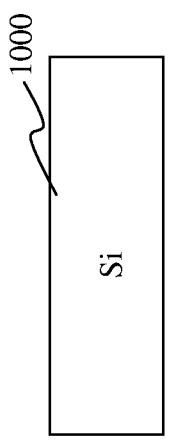
Fig. 10B
Fig. 10A

METHOD OF FABRICATING A GATE DIELECTRIC FOR HIGH-K METAL GATE DEVICES

PRIORITY DATA

This application claims priority to Provisional Application Ser. No. 61/099,137 filed on Sep. 22, 2008, entitled "METHOD OF FABRICATING A GATE DIELECTRIC FOR HIGH-K METAL GATE DEVICES," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. There has been a desire to fabricate these devices with a metal material for the gate electrode and a high-k dielectric for the gate dielectric. An interfacial layer, such as an oxide layer, is typically formed between the high-k dielectric layer and the silicon substrate to facilitate formation of the high-k dielectric layer and improve electrical properties at the interface. However, problems have arisen when forming the interfacial layer such as poor wetting characteristics for high-k deposition and oxide re-growth during subsequent processing.

Accordingly, what is needed is a new and improved method for forming an interfacial layer and high-k dielectric layer on a substrate.

SUMMARY

One of the broader forms of an embodiment of the present invention involves a method of fabricating a semiconductor device. The method includes providing a substrate, forming an interfacial layer on the substrate by treating the substrate with radicals, wherein the radicals are selected from the group consisting of hydrous radicals, nitrogen/hydrogen radicals, and sulfur/hydrogen radicals, and forming a high-k dielectric layer on the interfacial layer.

Another one of the broader forms of an embodiment of the present invention involves a method of fabricating a semiconductor device. The method includes providing a substrate, performing a first treatment on the substrate to form a first dielectric layer over the substrate, the first treatment including first radicals, performing a second treatment on the first dielectric layer to form a second dielectric layer over the substrate, the second treatment including second radicals different from the first radicals, wherein the first and second radicals are each hydrous radicals or nitrogen/hydrogen radicals, and forming a high-k dielectric layer over the first and second dielectric layers.

Yet another one of the broader forms of an embodiment of the present invention involves a method of fabricating a semiconductor device. The method includes providing a substrate, forming an interfacial layer on the substrate including performing at least one treatment on the substrate, the at least one treatment including one of a plasma process and a UV process, the at least one treatment utilizing radicals selected from the group consisting of hydrous radicals, nitrogen/hydrogen radicals, and sulfur/hydrogen radicals, and forming a high-k dielectric layer on the interfacial layer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5A to 5C are cross-sectional views of the formation of the interfacial layer and high-k dielectric layer according to the method of FIG. 4;

FIGS. 6A to 6C are cross-sectional views of another formation of an interfacial layer and high-k dielectric layer;

FIGS. 7A to 7C are cross-sectional views of yet another formation of an interfacial layer and high-k dielectric layer;

FIGS. 9A to 9D are cross-sectional views of the formation of the interfacial layer and high-k dielectric layer according to the method of FIG. 8; and FIGS. 10A to 10D are cross-sectional views of an alternative method for forming an interfacial layer by a double treatment process and depositing a high-k dielectric layer on a substrate according to various aspects of the present disclosure.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
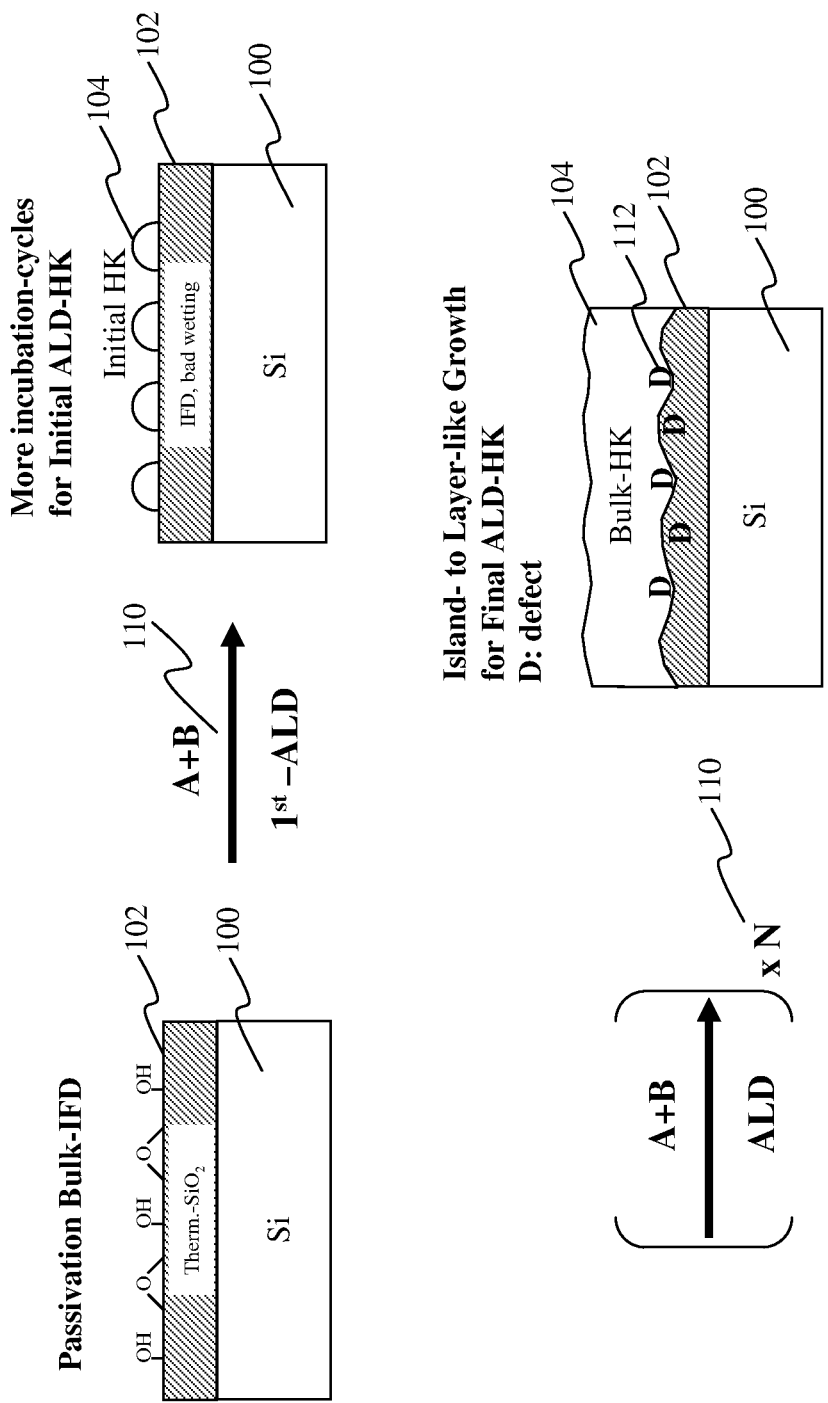
FIG. 1 is a diagrammatic representation of a method for forming an interfacial layer and high-k dielectric layer of a semiconductor device.

Referring to FIG. 1, illustrated is a diagrammatic representation of an interfacial layer and high-k dielectric layer being formed on a semiconductor substrate. The semiconductor substrate 100 includes a silicon substrate. The substrate 100 may include various doping configurations depending on design requirements as is known in the art. The substrate 100 may also include other elementary semiconductors such as germanium and diamond. Alternatively, the substrate 100 may include a compound semiconductor and/or an alloy semiconductor. Further, the substrate 100 may optionally include an epitaxial layer (epi layer), may be strained for performance enhancement, and may include a silicon-on-insulator (SOI) structure.

The interfacial layer 102 may be formed on the substrate 100. The interfacial layer 102 may include a silicon oxide ($SiO_2$) that is formed by growing thermally oxidized $SiO_2$ film (e.g., thermal oxide) to a desired thickness as is known in the art. However, a top surface of the thermal oxide has a poor wetting characteristic for a subsequent deposition process of a high-k dielectric layer. The high-k dielectric layer 104 may be formed on the interfacial layer 102 by an atomic layer deposition (ALD) process or so-called atomic layer chemical vapor deposition (ALCVD) process 110, denoted as A+B, which is formed by a combination of two half-reactions in the ALD process. One of the half-reaction includes providing a metal precursor (A), such as Tetrakis (ethylmethylamido)hafnium (i.e., $Hf[NCH_3C_2H_5]_4$, TEMAH), to chemisorb on the substrate surface. The other half-reaction includes providing a second precursor (B), such as an O species, to chemisorb on the substrate surface. Between the two half-reactions, an unreactive inert gas, such as Ar or $N_2$, is used for purging away excess precursors A and B which are physisorbed onto the substrate surface. The typical ALD process is consistent of A(B) pulse, inert gas purge, B(A) pulse, inert gas purge, and then repeats this sequence. Accordingly, the ALD process 110 implements a series of steps to form layers of the high-k dielectric material.

For example, the high-k dielectric layer 104 may include hafnium oxide ($HfO_2$). An initial (e.g., first) high-k dielectric layer 104 is formed by ALD on the top surface of the interfacial layer 102. The ALD process 110 is repeated for each subsequent layer of the high-k dielectric layer 104 to be formed until a desired thickness is achieved. It has been observed that there are more incubation-cycles for the initial layer of the ALD process due to the poor wetting characteristic of top surface of the interfacial layer 102. Accordingly, the subsequent layers of the high-k dielectric layer may experience an island-to-layer like formation (e.g., rough growth). Thus, the interface between the high-k dielectric layer 104 and the interfacial layer 102 may include defects 112 which may adversely effect device performance such as gate leakage current.

Figure 2:
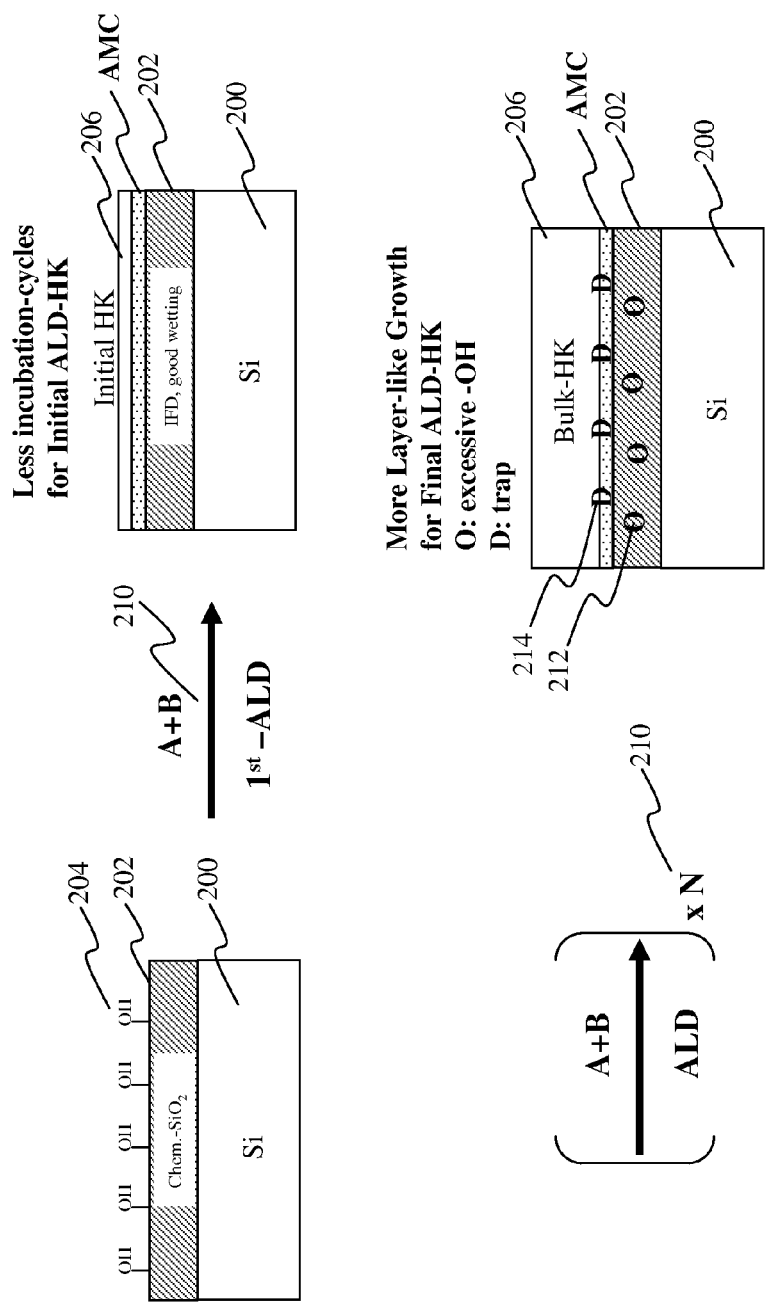
FIG. 2 is a diagrammatic representation of an alternative method for forming an interfacial layer and high-k dielectric layer of a semiconductor device.

Referring to FIG. 2, illustrated is diagrammatic representation of an interfacial layer and high-k dielectric layer being formed on semiconductor substrate. The semiconductor substrate 200 includes a silicon substrate. The interfacial layer 202 may be formed on the substrate 200. The interfacial layer 202 may include a silicon oxide ($SiO_2$) that is formed by a wet chemical oxide process as is known in the art. The thickness of the chemical oxide is easier to control to less than 1 nm as compared to the thermally grown oxide. Further, a top surface of the chemical oxide include hydroxyl groups (—OH) 204 that provide a good wetting characteristic for a subsequent deposition of a high-k dielectric layer. Accordingly, there are less incubation cycles for forming the initial (first) layer of the high-k dielectric layer by ALD.

The high-k dielectric layer 206 may be formed on the interfacial layer 202 by an ALD process 210. The ALD process 210 implements a series of steps to form layers of the high-k dielectric material. For example, the high-k dielectric layer 206 may include hafnium oxide ($HfO_2$). An initial (e.g., first) high-k dielectric layer is formed by ALD on the top surface of the interfacial layer 202. The ALD process 210 (e.g., A+B) is repeated for each subsequent layer of the high-k dielectric layer 206 to be formed until a desired thickness is achieved. However, it has been observed that the chemical oxide yields excessive —OH groups 212 in the bulk interfacial layer 202 and also electrical traps 214 induced by atmosphere contamination (AMC) at the interface with the high-k dielectric 206. This may lead to oxide re-growth during subsequent processing, and thus the thickness of the interfacial layer 202 will undesirably increase.

Figure 3:
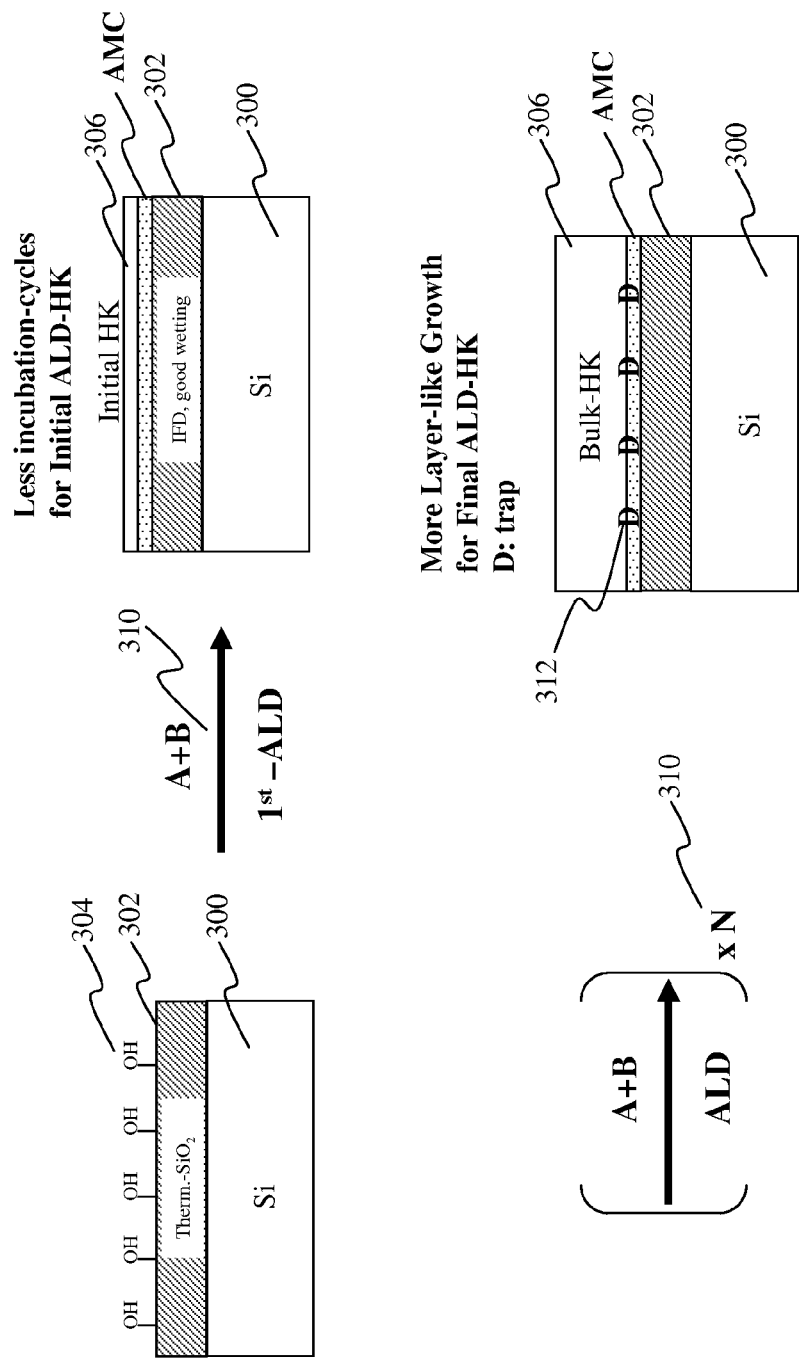
FIG. 3 is a diagrammatic representation of another alternative method for forming an interfacial layer and high-k dielectric layer of a semiconductor device.

Referring to FIG. 3, illustrated is a diagrammatic representation of an interfacial layer and high-k dielectric layer being formed on semiconductor substrate. The semiconductor substrate 300 includes a silicon substrate. The interfacial layer 302 may be formed on the substrate 300. The interfacial layer 302 may include a silicon oxide ($SiO_2$) that is formed by a thermal growth process with a wet treatment That is, the oxide is thermally grown as was discussed above in FIG. 1, and the top surface 304 of the oxide layer is treated with a wet treatment to provide a good wetting characteristic for a subsequent deposition of a high-k dielectric layer. Accordingly, there are less —OH groups in the bulk oxide and less incubation cycles for forming the initial (first) layer of the high-k dielectric layer by ALD.

The high-k dielectric layer 306 may be formed on the interfacial layer 302 by an ALD process 310. The ALD process 310 implements a series of steps to form layers of the high-k dielectric material. For example, the high-k dielectric layer 306 may include hafnium oxide ($HfO_2$). An initial (e.g., first) high-k dielectric layer is formed by ALD on the top surface of the interfacial layer 302. The ALD process 310 (e.g., A+B) is repeated for each subsequent layer of the high-k dielectric layer 306 to be formed until a desired thickness is achieved. However, it has been observed that the interfacial layer 302 exhibits electrical traps 312 at the interface with high-k dielectric layer 306 and atmosphere contamination issues, and thus oxide re-growth at the interface may occur. Further, it has been observed that thermal oxide is harder to control than chemical oxide in FIG. 2, as equivalent oxide thickness (EOT) of the interfacial layer is <7 angstrom (Å). Accordingly, it may be challenging to achieve the design requirements for the gate stack (e.g., EOT<8 angstrom (Å)) for advanced technology nodes.

Figure 4:
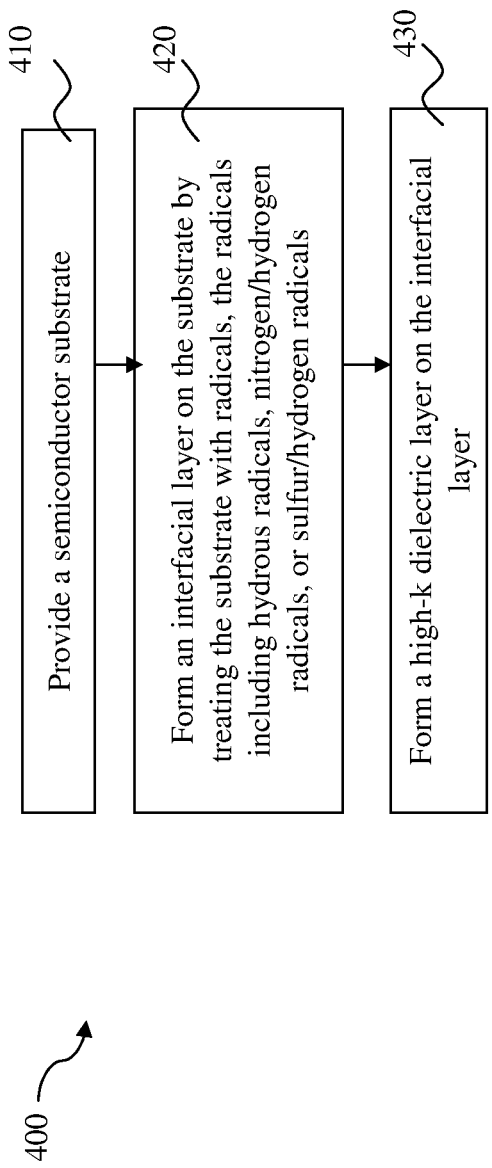
FIG. 4 is a flowchart illustrating a method for forming an interfacial layer and high-k dielectric on a substrate according to various aspects of the present disclosure.

Referring to FIG. 4, illustrated is a method 400 for fabricating an interfacial layer and high-k dielectric layer on a substrate. The method 400 is a single treatment process for forming the interfacial layer with a top surface modification. Referring also to FIGS. 5A to 5B, illustrated are cross-sectional views of the formation of the interfacial layer and high-k dielectric layer on the substrate according to the method 400 of FIG. 4. The method 400 begins with block 410 in which the substrate 500 may be provided. In FIG. 5A, the substrate 500 may include a silicon (Si) substrate. The substrate 500 may include various doping configurations (e.g., N-well or P-well) depending on design requirements as is known in the art. The substrate 500 may also include other elementary semiconductors such as germanium and diamond. Alternatively, the substrate 500 may include a compound semiconductor and/or an alloy semiconductor. Further, the substrate 500 may optionally include an epitaxial layer (epi layer), may be strained for performance enhancement, and may include a silicon-on-insulator (SOI) structure. Moreover, the substrate 500 may include Ge, Ga, As, In, Sb, Al, combinations thereof, or other suitable substrates found in semiconductor devices.

The method 400 continues with block 420 in which an interfacial layer 502 may be formed over the substrate 500. In FIG. 5B, the interfacial layer 502 may be formed by treating the H-terminated silicon substrate 500 with radicals generated by a plasma process 503. The radicals may include hydrous radicals. The hydrous radicals may be generated by plasma containing O and H atoms. The substrate 500 may be placed in a process chamber that is configured to provide a suitable environment for the plasma process. In the present embodiment, a plasma process 503 may implement an $H_2O$/Ar plasma (for generating hydrous radicals) for forming a silicon oxide ($SiO_2$) for the interfacial layer 502.

The plasma process 503 may include the following process conditions for the process chamber. The plasma process 503 may include a temperature that is less than or equal to 500 degree C., a total pressure ranging from 0.005 to about 10 Torr, a plasma power (RF power) less than or equal to 200 W, a $H_2O$ partial pressure less than or equal to 0.1 Torr (diluted by Ar gas), Ar flow rate ranging approximately from 1000 to 200 sccm, and the treatment time less than or equal to 1 minute. The gas flow parameter may be used to stabilize pressure and reactive gas concentration. Additionally, the treatment may be controlled by controlling the exposure period or total time of generating radicals by the plasma. The plasma may be generated in the main process chamber or may be generated remotely in a pre-chamber and the remote plasma supplied to the main process chamber.

It should be noted the plasma process 503 (e.g., total pressure and $H_2O$ pressure) facilitates easier control of the thickness of the interfacial layer 502 and promotes a denser and defect-less bulk interfacial layer 502 at low temperature (≤500 degree C.). The equivalent oxide thickness (EOT) of the interfacial layer 502 may be less than or equal to 7 angstrom (Å). As such, there is suppression of thermal induced diffusion for oxide re-growth. Further, the plasma process 503 at the same time modifies the top surface of the interfacial layer 502 to provide for better wetting characteristics (e.g., —OH function group 504) for a subsequent deposition (ALD or CVD) of a high-k dielectric layer. Alternatively, the interfacial layer of $SiO_2$ may be initially formed (by other techniques) with a physical thickness that is less than or equal to 5 angstrom (Å), and a radical surface treatment discussed above may be performed on the $SiO_2$ interfacial layer/Si substrate configuration to improve surface conditions of the interfacial layer for better formation of the high-k dielectric layer as will be described below.

The method 400 continues with block 430 in which a high-k dielectric layer 506 may be formed on the interfacial layer 502. In FIG. 5C, the high-k dielectric layer 506 may include hafnium oxide ($HfO_2$). The high-k dielectric layer 506 may be formed on the interfacial layer 502 by an ALD process 510. The ALD process 510 implements a series of steps to form layers of the high-k dielectric material as was discussed above. Each of the layers is formed by providing a cation precursor (A) (such as an Hf species for example TEMAH) to the top surface of the interfacial layer 502, and then providing an anion precursor (B) (such as an O species for example $D_2O$), to react with the cation precursor to form a layer of the high-k dielectric layer 506. The ALD process 510 (e.g., precursorA+precursorB) is repeated for each subsequent layer of the high-k dielectric layer 506 to be formed until a desired thickness is achieved. It is understood that other precursors may be used for form the high-k dielectric layer 506.

Alternatively, the high-k dielectric layer 506 may optionally include other high-k dielectric materials such as hafnium oxynitride (HfON), hafnium silicon oxide (HfSiO), hafnium silicon oxynitride (HfSiON), hafnium tantalum oxide (HfTaO), hafnium tantalum oxynitride (HfTaON), hafnium titanium oxide (HfTiO), hafnium titanium oxynitride (HfTiON), hafnium zirconium oxide (HfZrO), hafnium zirconium oxynitride (HfZrON), hafnium aluminum oxide (HfAlO), hafnium aluminum oxynitride (HfAlON), hafnium lanthanum oxide (HfLaO), hafnium lanthanum oxynitride (HfLaON), and combinations thereof. Alternatively, the high-k dielectric layer may be formed by a metal-organic chemical vapor deposition (MOCVD) or other suitable CVD process as is known in the art. It should be noted that the formation of the interfacial layer 502 and high-k dielectric layer 506 may performed in situ (e.g., within the ALD process chamber). In other words, the formation of the interfacial layer 502 and high-k dielectric layer 506 may be formed without exposure to the atmosphere from substrate treatment to high-k deposition. Accordingly, there may less atmosphere contamination at the substrate 500(channel)/interfacial layer 502 interface, and at the interfacial layer 502/high-k dielectric layer 506 interface.

It is understood that the method 400 may continue with a semiconductor process flow to form various microelectronic devices such as transistors, resistors, capacitors, etc. of an integrated circuit. For example, the interfacial layer 502 and the high-k dielectric 506 may be used as the gate dielectric for various nMOSFET and pMOSFET devices formed in the substrate 500.

Referring to FIGS. 6A to 6C, illustrated are cross-sectional views of an alternative method for forming an interfacial layer and high-k dielectric layer on a substrate. In FIG. 6A, the substrate 600 may include a silicon (Si) substrate. The substrate 600 may include various doping configurations (e.g., N-well or P-well) depending on design requirements as is known in the art. The substrate 600 may also include other elementary semiconductors such as germanium and diamond. Alternatively, the substrate 600 may include a compound semiconductor and/or an alloy semiconductor. Further, the substrate 600 may optionally include an epitaxial layer (epi layer), may be strained for performance enhancement, and may include a silicon-on-insulator (SOI) structure. Moreover, the substrate 600 may include Ge, Ga, As, In, Sb, Al, combinations thereof, or other suitable substrates found in semiconductor devices. In the present example, the substrate 600 may include H-terminated silicon substrate.

In FIG. 6B, the interfacial layer 602 may be formed by treating 603 the silicon substrate 600 with radicals generated by a plasma process or ultraviolet (UV) process. The treatment 603 could be performed in situ (e.g., within the ALD process chamber) or ex situ (e.g., exposure to the atmosphere). The radicals may include hydrous radicals and/or nitrogen/hydrogen radicals. The radicals that are selected may depend the desired configuration of interfacial layer 602. The substrate 600 may be placed in a process chamber that is configured to provide a suitable environment for the plasma or UV process. The hydrous radicals may be generated by plasma or UV with ambiance containing O and H atoms. For example, the hydrous radicals may be generated using a gas such as $H_2O$, $H_2O_2$, $H_2$, $O_2$, $N_2$, Ar, He, or combinations thereof. The nitrogen/hydrogen radicals may be generated by plasma or UV with ambiance containing N and H atoms. For example, the nitrogen/hydrogen radicals may be generated using a gas such as $NH_3$, $N_2H_2$, $N_2H_4$, $N_2$, $H_2$, NO, $N_2O$, Ar, He, or combinations thereof. The interfacial layer 602 may include a silicon oxide ($SiO_2$) formed by the process conditions discussed below for the plasma or UV process. Alternatively, the interfacial layer may optionally include silicon nitride ($SiN_x$) or silicon oxynitride ($SiO_xN_y$).

In one embodiment, the plasma process may include the following process conditions for the process chamber. The plasma process may include a temperature that is less than or equal to 500 degree C., a total pressure ranging from 0.005 to about 10 Torr, a plasma power (RF power) less than or equal to 200 W, a $H_2O$ partial pressure less than or equal to 0.1 Torr (diluted by inert gas) for generating hydrous radicals, $NH_3$ flow rate less than or equal to 500 sccm (diluted by inert gas) for generating nitrogen/hydrogen radicals, Ar flow rate ranging approximately from 1000 to 200 sccm, and the treatment time less than or equal to 1 minute. The gas flow parameter may be used to stabilize pressure and reactive gas concentration. Additionally, the treatment may be controlled by controlling the exposure period or total time of generating radicals by the plasma. The plasma may be generated in the main process chamber or may be generated remotely in a pre-chamber and the remote plasma supplied to the main process chamber.

In another embodiment, the UV process may include the following process conditions for the process chamber. The UV process may include a temperature that is less than or equal to 500 degree C., a total pressure ranging from 0.005 to about 10 Torr, a wavelength (UV source) less than or equal to 200 nm, a $H_2O$ partial pressure less than or equal to 0.1 Torr (diluted by inert gas) for generating hydrous radicals, $NH_3$ flow rate less than or equal to 500 sccm (diluted by inert gas) for generating nitrogen/hydrogen radicals, Ar flow rate ranging approximately from 1000 to 200 sccm, and the UV "turn on" time less than or equal to 1 minute. The gas flow parameter may be used to stabilize pressure and reactive gas concentration. Additionally, the treatment may be controlled by controlling the exposure period or total time of generating radicals by the UV light.

It should be noted that both the plasma and UV processes (e.g., total pressure and $H_2O$ pressure) facilitate easier control of the thickness of the interfacial layer 602 and promote a denser and defect-less bulk interfacial layer 602 at low temperature (≤500 degree C.). The equivalent oxide thickness (EOT) of the interfacial layer 602 may be less than or equal to 7 angstrom (Å). As such, there is suppression of thermal induced diffusion for oxide re-growth. Further, the plasma and UV processes both modify the top surface of the interfacial layer 602 to provide for better wetting characteristics (e.g., —OH or $NH_x$ function group 604) for a subsequent deposition (ALD or CVD) of a high-k dielectric layer. Alternatively, the interfacial layer of SiON may be initially formed (by other techniques) with a physical thickness that is less than or equal to 5 angstrom (Å), and a radical surface treatment discussed above may be performed on the SiON interfacial layer/Si substrate configuration to improve surface conditions of the interfacial layer for better formation of the high-k dielectric layer as will be described below.

In FIG. 6C, the high-k dielectric layer 606 may include hafnium oxide ($HfO_2$). The high-k dielectric layer 606 may be formed on the interfacial layer 602 by an ALD process 610. The ALD process 610 implements a series of steps to form layers of the high-k dielectric material. Each of the layers is formed by providing a cation precursor (A) (such as an Hf species for example TEMAH) to the top surface of the interfacial layer 602, and then providing an anion precursor (B) (such as an O species for example $D_2O$), to react with the cation precursor to form a layer of the high-k dielectric layer 606. The ALD process 610 (e.g., precursorA+precursorB) is repeated for each subsequent layer of the high-k dielectric layer 606 to be formed until a desired thickness is achieved. It is understood that other precursors may be used for form the high-k dielectric layer 606.

Alternatively, the high-k dielectric layer 606 may optionally include other high-k dielectric materials such as hafnium oxynitride (HfON), hafnium silicon oxide (HfSiO), hafnium silicon oxynitride (HfSiON), hafnium tantalum oxide (HfTaO), hafnium tantalum oxynitride (HfTaON), hafnium titanium oxide (HfTiO), hafnium titanium oxynitride (HfTiON), hafnium zirconium oxide (HfZrO), hafnium zirconium oxynitride (HfZrON), hafnium aluminum oxide (HfAlO), hafnium aluminum oxynitride (HfAlON), hafnium lanthanum oxide (HfLaO), hafnium lanthanum oxynitride (HfLaON), and combinations thereof. Alternatively, the high-k dielectric layer may be formed by a metal-organic chemical vapor deposition (MOCVD) or other suitable CVD process as is known in the art.

Referring to FIGS. 7A to 7C, illustrated are cross-sectional views of another alternative method for forming an interfacial layer and high-k dielectric layer on a substrate. In FIG. 7A, the substrate 700 may include a GaAs substrate. The substrate 700 may include various doping configurations (e.g., N-well or P-well) depending on design requirements as is known in the art. The substrate 700 may also include other elementary semiconductors such as germanium and diamond. Alternatively, the substrate 700 may include a compound semiconductor and/or an alloy semiconductor. Further, the substrate 700 may optionally include an epitaxial layer (epi layer), may be strained for performance enhancement, and may include a silicon-on-insulator (SOI) structure. Moreover, the substrate 700 may include Si, Ge, Ga, As, In, Sb, Al, combinations thereof, or other suitable substrates found in semiconductor devices.

In FIG. 7B, the interfacial layer 702 may be formed by treating 703 the GaAs substrate 700 with radicals generated by a plasma process or ultraviolet (UV) process. The treatment 703 could be performed in situ (e.g., without exposure to the atmosphere from substrate treatment to high-k deposition) or ex situ (e.g., with exposure to the atmosphere). The radicals may include sulfur/hydrogen radicals. The substrate 700 may be placed in a process chamber that is configured to provide a suitable environment for the plasma or UV process. The sulfur/hydrogen radicals may be generated by a gas such as $H_2S$, $(NH_4)_2S$, $NH_3$, Ar, He, or combinations thereof. In some embodiments, a gas mixture of $H_2S/Ar$ may be used. In other embodiment, a gas mixture of $(NH_4)_2S/Ar$ may be used. In some other embodiments, a gas mixture of $NH_3/H_2S/Ar$ may be used. In still other embodiments, a gas mixture of $H_2S/He$ may be used. The interfacial layer 702 may include a $GaS_x$ and/or $AsS_x$ layer formed by the process conditions discussed below for the plasma or UV process.

In one embodiment, the plasma process may include the following process conditions for the process chamber. The plasma process may include a temperature that is less than or equal to 500 degree C., a total pressure ranging from 0.005 to about 10 Torr, a plasma power (RF power) less than or equal to 200 W, a $H_2S$ partial pressure less than or equal to 0.1 Torr (diluted by inert gas), $NH_3$ flow rate less than or equal to 500 sccm (diluted by inert gas), Ar flow rate ranging approximately from 1000 to 200 sccm, and the treatment time less than or equal to 1 minute. The gas flow parameter may be used to stabilize pressure and reactive gas concentration. Additionally, the treatment may be controlled by controlling the exposure period or total time of generating radicals by the plasma. The plasma may be generated in the main process chamber or may be generated remotely in a pre-chamber and the remote plasma supplied to the main process chamber. Further, Ar may be replaced by He or mixed with He to control radical concentration and momentum.

In another embodiment, the UV process may include the following process conditions for the process chamber. The UV process may include a temperature that is less than or equal to 500 degree C., a total pressure ranging from 0.005 to about 10 Torr, a wavelength (UV source) less than or equal to 200 nm, a $H_2S$ partial pressure less than or equal to 0.1 Torr (diluted by inert gas), $NH_3$ flow rate less than or equal to 500 sccm (diluted by inert gas), Ar flow rate ranging approximately from 1000 to 200 sccm, and the UV "turn on" time less than or equal to 1 minute. The gas flow parameter may be used to stabilize pressure and reactive gas concentration. Additionally, the treatment may be controlled by controlling the exposure period or total time of generating radicals by the UV light. Further, Ar may be replaced by He or mixed with He to control radical concentration and momentum.

It should be noted that the plasma and UV processes both (e.g., total pressure and $H_2O$ pressure) facilitate easier control of the thickness of the interfacial layer 702 and promote a denser and defect-less bulk interfacial layer 702 at low temperature (≤500 degree C.). The equivalent oxide thickness (EOT) of the interfacial layer 702 may be less than or equal to 7 angstrom (Å). As such, there is suppression of thermal induced diffusion for oxide re-growth. Further, the plasma and UV processes both modify the top surface of the interfacial layer 702 to provide for better wetting characteristics (e.g., —$SH_x$ function group 704) for a subsequent deposition (ALD or CVD) of a high-k dielectric layer.

In FIG. 7C, the high-k dielectric layer 706 may include hafnium oxide ($HfO_2$). The high-k dielectric layer 706 may be formed on the interfacial layer 702 by an ALD process 710. The ALD process 710 implements a series of steps to form layers of the high-k dielectric material. Each of the layers is formed by providing a cation precursor (A) (such as an Hf species for example TEMAH) to the top surface of the interfacial layer 702, and then providing an anion precursor (B) (such as an O species for example $D_2O$), to react with the cation precursor to form each layer of the high-k dielectric layer 706. The ALD process 710 (e.g., precursorA+precursorB) is repeated for each subsequent layer of the high-k dielectric layer 706 to be formed until a desired thickness is achieved. It is understood that other precursors may be used for forming the high-k dielectric layer 706.

Alternatively, the high-k dielectric layer 706 may optionally include other high-k dielectric materials such as hafnium oxynitride (HfON), hafnium silicon oxide (HfSiO), hafnium silicon oxynitride (HfSiON), hafnium tantalum oxide (HfTaO), hafnium tantalum oxynitride (HfTaON), hafnium titanium oxide (HfTiO), hafnium titanium oxynitride (HfTiON), hafnium zirconium oxide (HfZrO), hafnium zirconium oxynitride (HfZrON), hafnium aluminum oxide (HfAlO), hafnium aluminum oxynitride (HfAlON), hafnium lanthanum oxide (HfLaO), hafnium lanthanum oxynitride (HfLaON), and combinations thereof. Alternatively, the high-k dielectric layer may be formed by a metal-organic chemical vapor deposition (MOCVD) or other suitable CVD process as is known in the art.

Figure 8:
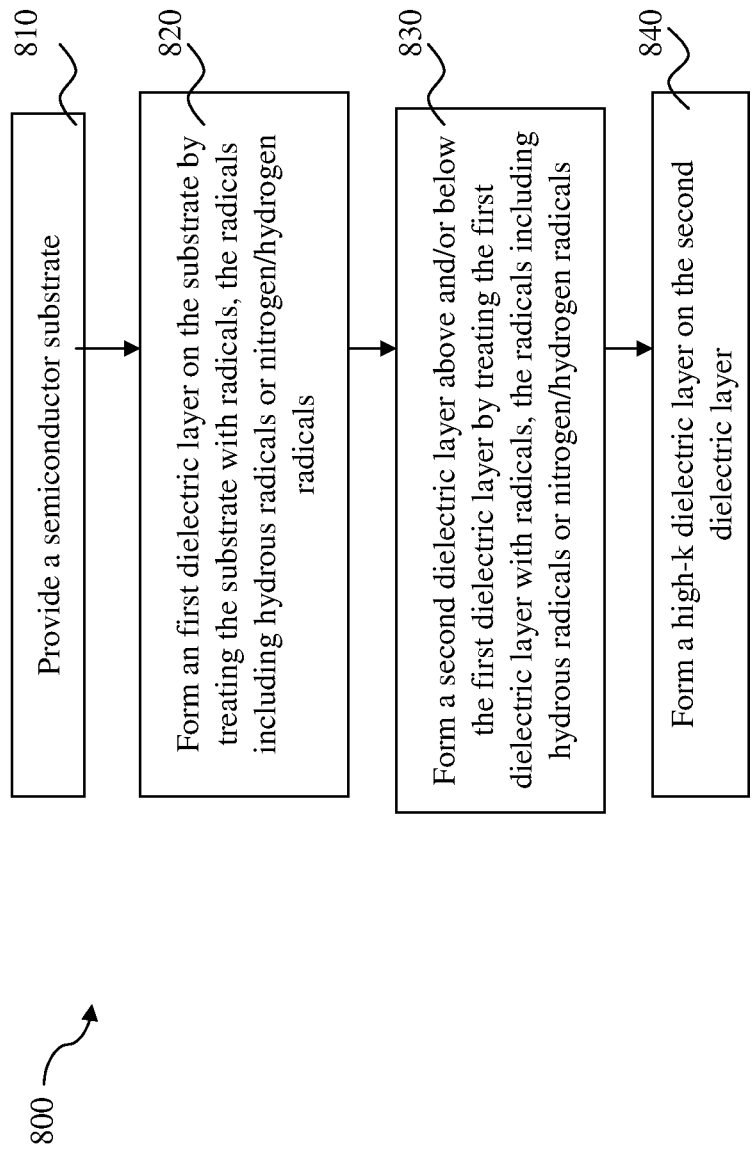
FIG. 8 is a flowchart illustrating another method for forming an interfacial layer and high-k dielectric layer according to various aspects of the present disclosure.

Referring to FIG. 8, illustrated is a method 800 for fabricating an interfacial layer and high-k dielectric layer on a substrate. The method 800 is a double treatment process for forming the interfacial layer with a top surface modification. Referring also to FIGS. 9A to 9D, illustrated are cross-sectional views of the formation of the interfacial layer and high-k dielectric layer on the substrate according to the method 800 of FIG. 8. The method 800 begins with block 810 in which a substrate 900 is provided. In FIG. 9A, the substrate 900 may include a silicon (Si) substrate. The substrate 900 may include various doping configurations (e.g., N-well or P-well) depending on design requirements as is known in the art. The substrate 900 may also include other elementary semiconductors such as germanium and diamond. Alternatively, the substrate 900 may include a compound semiconductor and/or an alloy semiconductor. Further, the substrate 900 may optionally include an epitaxial layer (epi layer), may be strained for performance enhancement, and may include a silicon-on-insulator (SOI) structure. Moreover, the substrate 900 may include Ge, Ga, As, In, Sb, Al, combinations thereof, or other suitable substrates found in semiconductor devices.

The method 800 continues with block 820 in which a first dielectric layer 902 is formed over the substrate 900. In FIG. 9B, the dielectric layer 902 may be formed by treating 903 (first treatment) the silicon substrate 900 with radicals generated by a plasma process or UV process. The treatment 903 could be performed in situ (e.g., without exposure to the atmosphere from substrate treatment to high-k deposition) or ex situ (e.g., with exposure to the atmosphere). The radicals may include hydrous radicals. The hydrous radicals may be generated by plasma or UV with ambiance containing O and H atoms. For example, the hydrous radicals may be generated using a gas such as $H_2O$, $H_2O_2$, $H_2$, $O_2$, $N_2$, Ar, He, or combinations thereof. The substrate 900 may be placed in a process chamber that is configured to provide a suitable environment for the plasma process or UV process. In the present embodiment, the dielectric layer 902 may include a silicon oxide ($SiO_x$) formed by the following process conditions for the plasma or UV process.

In one embodiment, the plasma process may include the following process conditions for the process chamber when using a gas mixture such as $H_2O$/Ar. The plasma process may include a temperature that is less than or equal to 500 degree C., a total pressure ranging from 0.005 to about 10 Torr, a plasma power (RF power) less than or equal to 200 W, a $H_2O$ partial pressure less than or equal to 0.1 Torr (diluted by inert gas), an Ar flow rate ranging approximately from 1000 to 200 sccm, and the treatment time less than or equal to 1 minute.

The gas flow parameter may be used to stabilize pressure and reactive gas concentration. Additionally, the treatment may be controlled by controlling the exposure period or total time of generating radicals by the plasma. The plasma may be generated in the main process chamber or may be generated remotely in a pre-chamber and the remote plasma supplied to the main process chamber. Further, Ar may be replaced by He or mixed with He to control radical concentration and momentum.

In another embodiment, the UV process may include the following process conditions for the process chamber when using a gas mixture such as $H_2O$/Ar. The UV process may include a temperature that is less than or equal to 500 degree C., a total pressure ranging from 0.005 to about 10 Torr, a wavelength (UV source) less than or equal to 200 nm, a $H_2O$ partial pressure less than or equal to 0.1 Torr (diluted by inert gas), an Ar flow rate ranging approximately from 1000 to 200 sccm, and the UV "turn on" time less than or equal to 1 minute.

The gas flow parameter may be used to stabilize pressure and reactive gas concentration. Additionally, the treatment may be controlled by controlling the exposure period or total time of generating radicals by the UV light. Further, Ar may be replaced by He or mixed with He to control radical concentration and momentum. It should be noted that following the first treatment 903 a top surface of the dielectric layer 902 may include hydroxyl (—OH) functional groups 904.

The method 800 continues with block 830 in which a second dielectric layer 906 is formed on the first dielectric layer 902. In FIG. 9C, the dielectric layer 906 may be formed by treating 908 (second treatment) on the dielectric layer 902 with radicals generated by a plasma process or UV process. The treatment 908 could be performed in situ (e.g., without exposure to the atmosphere from substrate treatment to high-k deposition) or ex situ (e.g., with exposure to the atmosphere). The radicals may include nitrogen/hydrogen radicals. The nitrogen/hydrogen radicals may be generated by plasma or UV with ambiance containing N and H atoms. For example, the nitrogen/hydrogen radicals may be generated by $NH_3$, $N_2H_2$, $N_2H_4$, $N_2$, $H_2$, NO, $N_2O$, Ar, He, or combinations thereof. The substrate 900 may be placed in a process chamber that is configured to provide a suitable environment for the plasma process or UV process. In the present embodiment, the dielectric layer 906 may include a silicon oxynitride ($SiO_xN_y$) or silicon nitride ($SiN_x$) formed by the following process conditions for the plasma or UV process.

In one embodiment, the plasma process may include the following process conditions for the process chamber when using a gas mixture such as $NH_3$/Ar. The plasma process may include a temperature that is less than or equal to 600 degree C., a total pressure ranging from 0.005 to about 10 Torr, a plasma power (RF power) less than or equal to 3000 W, a $NH_3$ flow rate less than or equal to 500 sccm, Ar flow rate ranging approximately from 1000 to 200 sccm, and the treatment time less than or equal to 5 minutes.

The gas flow parameter may be used to stabilize pressure and reactive gas concentration. Additionally, the treatment may be controlled by controlling the exposure period or total time of generating radicals by the plasma. The plasma may be generated in the main process chamber or may be generated remotely in a pre-chamber and the remote plasma supplied to the main process chamber. Further, Ar may be replaced by He or mixed with He to control radical concentration and momentum.

In another embodiment, the UV process may include the following process conditions for the process chamber when using a gas mixture such as $NH_3$/Ar. The UV process may include a temperature that is less than or equal to 600 degree C., a total pressure ranging from 0.005 to about 10 Torr, a wavelength (UV source) less than or equal to 200 nm, a $NH_3$ flow rate less than or equal to 500 sccm, Ar flow rate ranging approximately from 1000 to 200 sccm, and the UV "turn on" time less than or equal to 5 minutes.

The gas flow parameter may be used to stabilize pressure and reactive gas concentration. Additionally, the treatment may be controlled by controlling the exposure period or total time of generating radicals by the UV light. Further, Ar may be replaced by He or mixed with He to control radical concentration and momentum. It should be noted that following the second treatment 908 a top surface of the dielectric layer 906 may include amino (—$NH_x$) and/or hydroxyl (—OH) functional groups 909.

It should also be noted that various combinations of gases may be implemented for the first 903 and second 908 treatment processes. In one embodiment, the treatments may include a gas mixture such as $H_2O$/Ar, $H_2O/O_2$/Ar, $H_2O_2$/Ar, or $H_2/O_2$/Ar to form $SiO_xH_y$ by modulating reactivity and concentration of H and O radicals. The treatments may include a gas mixture such as $H_2O/N_2$/Ar, $H_2O_2/N_2$/Ar, or $H_2/O_2/N_2$ to form $SiO_xN_yH_z$ by modulating reactivity and concentration of H, O, and N radicals for N dopant≤3% in dielectric films. In another embodiment, the treatments may include a gas mixture such as $NH_3$/Ar, $N_2H_2$/Ar, $N_2H_4$/Ar, $N_2/H_2$/Ar, or $NH_3/H_2$/Ar to form $SiO_xN_yH_z$ by modulating reactivity and concentration of H, O, and N radicals for N dopant>3% in dielectric films. The treatments may include a gas mixture such as $NO/H_2$/Ar, $N_2O/H_2$/Ar, or $NH_3/NO/$Ar to form $SiO_xN_yH_z$ by modulating reactivity and concentration of H, O, and N radicals. Further, the first 903 and second 908 treatments may be implemented as $1^{st}$ plasma+ $2^{nd}$ plasma, $1^{st}$ UV+$2^{nd}$ plasma, $1^{st}$ plasma+$2^{nd}$ UV, and $1^{st}$ UV+$2^{nd}$ UV.

It should be noted that the plasma and UV processes both (e.g., total pressure and $H_2O$ pressure) facilitate easier control of the thickness of the dielectric layer 902 (with a equivalent oxide thickness (EOT)≤7 angstrom (Å)) and promote a denser and defect-less bulk interfacial layer at low temperature (≤500 degree C.). As such, there is suppression of thermal induced diffusion for oxide re-growth. Further, the plasma and UV processes both modify the top surface of the interfacial layer at a low temperature (≤600 degree C.) to provide for better wetting characteristics (e.g., —$NH_x$ or —OH functional group 909) for a subsequent deposition (ALD or CVD) of a high-k dielectric layer. As such, the dielectric layer 906 may include a physical thickness that is less than or equal to 3 angstrom (Å). Thus, the total EOT of the dielectric layers 902 and 906 is less than or equal to 7 angstrom (Å).

The method 800 continues with block 840 in which a high-k dielectric layer 912 is formed on the interfacial layer (the dielectric layers 902 and 906). Following the second treatment 908, a top surface of the dielectric layer 906 may include —OH and/or —$NH_x$ functional groups 909 to provide a better wetting interface for a subsequent deposition (ALD or CVD) of a high-k dielectric layer. In FIG. 9D, the high-k dielectric layer 912 may include hafnium oxide ($HfO_2$). The high-k dielectric layer 912 may be formed on the interfacial layer 902 and 906 by an ALD process 914. The ALD process 914 implements a series of steps to form layers of the high-k dielectric material. Each of the layers is formed by providing a cation precursor (A) (such as an Hf species for example TEMAH) to the top surface of the interfacial layer 902 and 906, and then providing an anion precursor (B) (such as an O species for example $D_2O$), to react with the cation precursor to form a layer of the high-k dielectric layer 912. The ALD process 914 (e.g., precursorA+precursorB) is repeated for each subsequent layer of the high-k dielectric layer 912 to be formed until a desired thickness is achieved. It is understood that other precursors may be used for form the high-k dielectric layer 912.

Alternatively, the high-k dielectric layer 912 may optionally include other high-k dielectric materials such as hafnium oxynitride (HfON), hafnium silicon oxide (HfSiO), hafnium silicon oxynitride (HfSiON), hafnium tantalum oxide (HfTaO), hafnium tantalum oxynitride (HfTaON), hafnium titanium oxide (HfTiO), hafnium titanium oxynitride (HfTiON), hafnium zirconium oxide (HfZrO), hafnium zirconium oxynitride (HfZrON), hafnium aluminum oxide (HfAlO), hafnium aluminum oxynitride (HfAlON), hafnium lanthanum oxide (HfLaO), hafnium lanthanum oxynitride (HfLaON), and combinations thereof. Alternatively, the high-k dielectric layer may be formed by a metal-organic chemical vapor deposition (MOCVD) or other suitable CVD process as is known in the art.

Figure 10C:
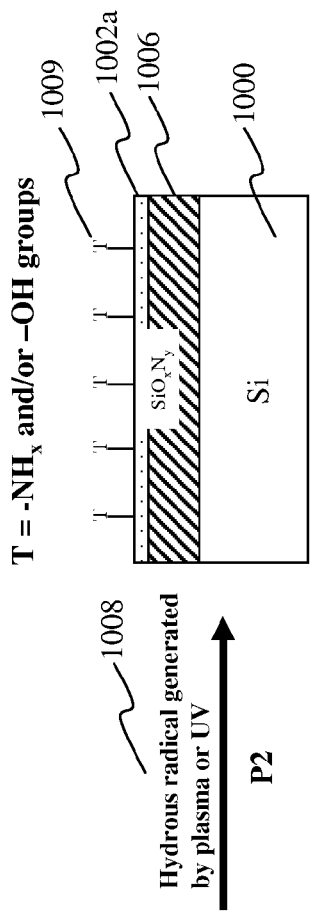

Referring to FIGS. 10A to 10D, illustrated are cross-sectional views of a semiconductor device being fabricated according an alternative embodiment of the method 800 of FIG. 8. The alternative embodiment of FIG. 10 also utilizes a double treatment process and depositing high-k dielectric layer on a substrate. Accordingly, the semiconductor device of FIG. 10 is similar to the semiconductor device of FIG. 9 except for the differences discussed below. In FIG. 10A, a substrate 1000 includes a silicon (Si) substrate. The substrate 1000 may include various doping configurations (e.g., N-well or P-well) depending on design requirements as is known in the art. The substrate 1000 may also include other elementary semiconductors such as germanium and diamond. Alternatively, the substrate 1000 may include a compound semiconductor and/or an alloy semiconductor. Further, the substrate 1000 may optionally include an epitaxial layer (epi layer), may be strained for performance enhancement, and may include a silicon-on-insulator (SOI) structure. Moreover, the substrate 1000 may include Ge, Ga, As, In, Sb, Al, combinations thereof, or other suitable substrates found in semiconductor devices.

In FIG. 10B, a dielectric layer 1002 may be formed by treating 1003 (first treatment) the silicon substrate 1000 with radicals generated by a plasma process or UV process. The treatment 1003 could be performed in situ (e.g., without exposure to the atmosphere from substrate treatment to high-k deposition) or ex situ (e.g., with exposure to the atmosphere). In the present embodiment, the radicals include nitrogen/hydrogen radicals. The nitrogen/hydrogen radicals may be generated by plasma or UV with ambiance containing N and H atoms. For example, the nitrogen/hydrogen radicals may be generated by utilizing gases such as $NH_3$, $N_2H_2$, $N_2H_4$, $N_2$, $H_2$, NO, $N_2O$, Ar, He, or combinations thereof. The substrate 1000 may be placed in a process chamber that is configured to provide a suitable environment for the plasma process or UV process. In the present embodiment, the dielectric layer 1002 may be formed by the following process conditions for the plasma or UV process.

In an embodiment, the plasma process may include the following process conditions for the process chamber when using a gas mixture such as $NH_3$/Ar. The plasma process may include a temperature that is less than or equal to 600 degree C., a total pressure ranging from 0.005 to about 10 Torr, a plasma power (RF power) less than or equal to 3000 W, a $NH_3$ flow rate less than or equal to 500 sccm, Ar flow rate ranging approximately from 1000 to 200 sccm, and the treatment time less than or equal to 5 minutes.

The gas flow parameter may be used to stabilize pressure and reactive gas concentration. Additionally, the treatment may be controlled by controlling the exposure period or total time of generating radicals by the plasma. The plasma may be generated in the main process chamber or may be generated remotely in a pre-chamber and the remote plasma supplied to the main process chamber. Further, Ar may be replaced by He or mixed with He to control radical concentration and momentum.

In an embodiment, the UV process may include the following process conditions for the process chamber when using a gas mixture such as $NH_3$/Ar. The UV process may include a temperature that is less than or equal to 600 degree C., a total pressure ranging from 0.005 to about 10 Torr, a wavelength (UV source) less than or equal to 200 nm, a $NH_3$ flow rate less than or equal to 500 sccm, Ar flow rate ranging approximately from 1000 to 200 sccm, and the UV "turn on" time less than or equal to 5 minutes.

The gas flow parameter may be used to stabilize pressure and reactive gas concentration. Additionally, the treatment may be controlled by controlling the exposure period or total time of generating radicals by the UV light. Further, Ar may be replaced by He or mixed with He to control radical concentration and momentum.

In the present embodiment, the dielectric layer 1002 may include a silicon nitride ($SiN_x$) having a top surface that includes amino ($-NH_x$) functional groups 1004. In some other embodiments, the dielectric layer 1002 may include a silicon oxynitride ($SiO_xN_y$) having a top surface that includes amino ($-NH_x$) functional groups. The dielectric layer 1002 initially forms part of an interfacial layer.

FIG. 10C, a dielectric layer 1006 may be formed by a treatment 1008 process on the dielectric layer 1002 including $SiN_x$ and Si re-oxidation, respectively. The re-oxidation may be performed utilizing thermal annealing in a oxidizing ambient. In the present embodiment, the treatment 1008 treats the dielectric layer 1002 with radicals generated by a plasma process or UV process at a top surface and also at an interface with silicon substrate 1000. Accordingly, the dielectric layer 1006 is formed on the silicon substrate and a dielectric layer 1002a is formed on the dielectric layer 1006. The treatment 1008 can performed in situ (e.g., without exposure to the atmosphere) or ex situ (e.g., with exposure to the atmosphere from substrate treatment to high k deposition). In the present embodiment, the radicals may include hydrous radicals. The hydrous radicals may be generated by plasma or UV with ambiance containing O and H atoms. For example, the hydrous radicals may be generated using gases such as $H_2O$, $H_2O_2$, $H_2$, $O_2$, $N_2$, Ar, He, or combinations thereof. The substrate 1000 may be placed in a process chamber that is configured to provide a suitable environment for the plasma process or UV process. In the present embodiment, the dielectric layer 1006 may be formed by the following process conditions.

In an embodiment, the plasma process may include the following process conditions for the process chamber when using a gas mixture such as $H_2O$/Ar. The plasma process may include a temperature that is less than or equal to 500 degree C., a total pressure ranging from 0.005 to about 10 Torr, a plasma power (RF power) less than or equal to 200 W, a $H_2O$ partial pressure less than or equal to 0.1 Torr (diluted by inert gas), Ar flow rate ranging approximately from 1000 to 200 sccm, and the treatment time less than or equal to 1 minute.

The gas flow parameter may be used to stabilize pressure and reactive gas concentration. Additionally, the treatment may be controlled by controlling the exposure period or total time of generating radicals by the plasma. The plasma may be generated in the main process chamber or may be generated remotely in a pre-chamber and the remote plasma supplied to the main process chamber. Further, Ar may be replaced by He or mixed with He to control radical concentration and momentum.

In another embodiment, the UV process may include the following process conditions for the process chamber when using a gas mixture such as $H_2O$/Ar. The UV process may include a temperature that is less than or equal to 500 degree C., a total pressure ranging from 0.005 to about 10 Torr, a wavelength (UV source) less than or equal to 200 nm, a H$_2$O partial pressure less than or equal to 0.1 Torr (diluted by inert gas), Ar flow rate ranging approximately from 1000 to 200 sccm, and the UV "turn on" time less than or equal to 1 minute.

The gas flow parameter may be used to stabilize pressure and reactive gas concentration. Additionally, the treatment may be controlled by controlling the exposure period or total time of generating radicals by the UV light. Further, Ar may be replaced by He or mixed with He to control radical concentration and momentum.

In the present embodiment, the dielectric layer 1006 may include a silicon oxide (SiO$_x$) and the dielectric layer 1002*a* may include a silicon oxynitride (SiO$_x$N$_y$) following the plasma or UV process. In other embodiments, the dielectric layer 1006 may optionally include a silicon oxynitride (SiO$_x$N$_y$). The dielectric layers 1002*a* and 1006 form the interfacial layer.

It should also be noted that various combinations of gases may be implemented for the first 1003 and second 1008 treatment processes. In one embodiment, the treatments may include a gas mixture such as H$_2$O/Ar, H$_2$O/O$_2$/Ar, H$_2$O$_2$/Ar, or H$_2$/O$_2$/Ar to form SiO$_x$H$_y$ by modulating reactivity and concentration of H and O radicals. The treatments may include a gas mixture such as H$_2$O/N$_2$/Ar, H$_2$O$_2$/N$_2$/Ar, or H$_2$/O$_2$/N$_2$ to form SiO$_x$N$_y$H$_z$ by modulating reactivity and concentration of H, O, and N radicals for N dopant≤3% in dielectric films. In another embodiment, the treatments may include a gas mixture such as NH$_3$/Ar, N$_2$H$_2$/Ar, N$_2$H$_4$/Ar, N$_2$/H$_2$/Ar, or NH$_3$/H$_2$/Ar to form SiO$_x$N$_y$H$_z$ by modulating reactivity and concentration of H, O, and N radicals for N dopant>3% in dielectric films. The treatments may include a gas mixture such as NO/H$_2$/Ar, N$_2$O/H$_2$/Ar, or NH$_3$/NO/Ar to form SiO$_x$N$_y$H$_z$ by modulating reactivity and concentration of H, O, and N radicals. Further, the first 1003 and second 1008 treatments may be implemented as 1$^{st}$ plasma+2$^{nd}$ plasma, 1$^{st}$ UV+2$^{nd}$ plasma, 1$^{st}$ plasma+2$^{nd}$ UV, and 1$^{st}$ UV+2$^{nd}$ UV.

It should be noted that both the plasma and UV processes (e.g., total pressure and H$_2$O pressure) facilitate easier control of the thickness of the dielectric layer 1006 (with a equivalent oxide thickness≤7 angstrom (Å)) and promote a denser and defect-less bulk interfacial layer at low temperature (≤500 degree C.). As such, there is suppression of thermal induced diffusion for oxide re-growth. Further, the plasma and UV processes both modify the top surface of the interfacial layer at a low temperature (≤600 degree C.) to provide for better wetting characteristics (e.g., —NH$_x$ or —OH functional groups 1009) for a subsequent deposition (ALD or CVD) of a high-k dielectric layer. As such, the dielectric layer 1002 may include a physical thickness that is less than or equal to 3 angstrom (Å). Thus, the total EOT of the dielectric layers 1002*a* and 1006 is less than or equal to 7 angstrom (Å).

Figure 10D:
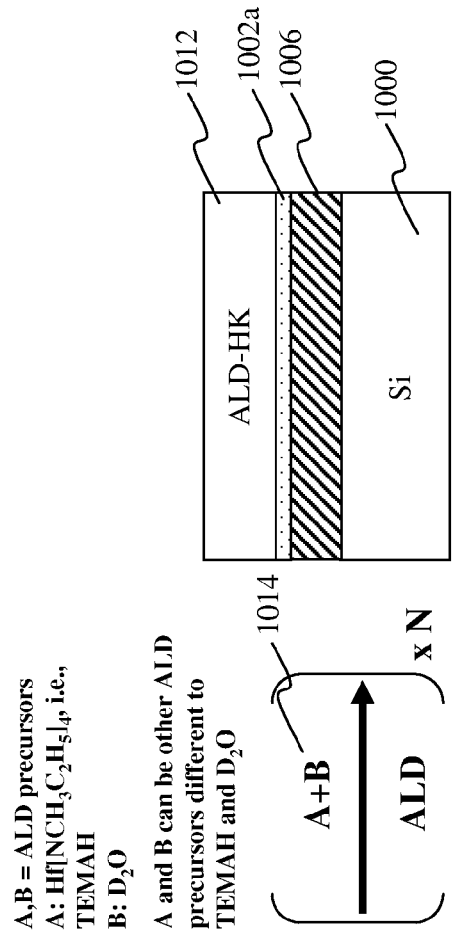

Following the second treatment 1008, a top surface of the dielectric layer 1002*a* may include —OH and/or —NH, functional groups 1009 to provide a better wetting interface for a subsequent deposition (ALD or CVD) of a high-k dielectric layer. In FIG. 10D, a high-k dielectric layer 1012 may include hafnium oxide (HfO$_2$). The high-k dielectric layer 1012 may be formed on the interfacial layer (dielectric layers 1002*a* and 1006) by an ALD process 1014. The ALD process 1014 implements a series of steps to form layers of the high-k dielectric material as was discussed above in FIG. 9. Each of the layers is formed by providing a cation precursor (A) (such as an Hf species for example or TEMAH) to the top surface of the interfacial layer (dielectric layers 1002*a* and 1006), and then providing a anion precursor (B) (such as an O species for example D$_2$O), to react with the cation precursor to form a layer of the high-k dielectric layer 1012. The ALD process 1014 (e.g., precursorA+precursorB) is repeated for each subsequent layer of the high-k dielectric layer 1012 to be formed until a desired thickness is achieved. It is understood that other precursors may be used for form the high-k dielectric layer 1012.

Alternatively, the high-k dielectric layer 1012 may optionally include other high-k dielectric materials such as hafnium oxynitride (HfON), hafnium silicon oxide (HfSiO), hafnium silicon oxynitride (HfSiON), hafnium tantalum oxide (HfTaO), hafnium tantalum oxynitride (HfTaON), hafnium titanium oxide (HfTiO), hafnium titanium oxynitride (HfTiON), hafnium zirconium oxide (HfZrO), hafnium zirconium oxynitride (HfZrON), hafnium aluminum oxide (HfAlO), hafnium aluminum oxynitride (HfAlON), hafnium lanthanum oxide (HfLaO), hafnium lanthanum oxynitride (HfLaON), and combinations thereof. Alternatively, the high-k dielectric layer may be formed by a metal-organic chemical vapor deposition (MOCVD) or other suitable CVD process as is known in the art.

It is understood that the substrates 900, 1000 may continue with semiconductor processing to form various microelectronic devices such as transistors, resistors, capacitors, etc. of an integrated circuit as is known in the art. For example, the interfacial layers (dielectric layers 902 and 906, and dielectric layers 1002*a* and 1006), the high-k dielectric 912, and the high-k dielectric 1012 may be implemented for the gate dielectric of various nFET and pFET devices. For example, processing continues with forming a metal layer over the high-k dielectric layer. The metal layer may include an N work function metal (N-metal) or P work function metal (P-metal). The metal layer may be formed by various deposition techniques such as physical vapor deposition (PVD or sputtering), CVD, ALD, plating, or other suitable technique. A polysilicon (or poly) layer may be formed over the metal layer by CVD or other suitable deposition process. A hard mask layer may then be formed over the poly layer. The various materials layers may then be patterned to form a gate structure as is known in the art.

The present invention achieves different advantages in various embodiments. For example, the present disclosed method provides a dense interfacial layer with surface modification at low temperatures. Accordingly, some of the advantages include (1) substrate (channel)/interfacial layer interface passivation, (2) interfacial layer surface modification (better wetting interface) for high-k deposition precursor, (3) interfacial layer/high-k interface passivation after high-k deposition, (4) less atmosphere contamination at the interfaces, (5) suppression of thermal induced diffusion, and (6) EOT scaling for gate dielectric to be less than 10 angstrom. Thus, the EOT of the gate dielectric may be achieved for advance technology nodes (e.g., 45 nm and below). Accordingly, performance of the NMOS and PMOS devices may become more reliable and predictable. Also, the methods disclosed herein are compatible with current CMOS technology process flow, and thus can easily be integrated with current processing equipment and device technologies. It is understood that different embodiments disclosed herein offer different advantages, and that no particular advantage is necessarily required for all embodiments.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the interfacial layer and high-dielectric layer of the disclosed embodiments may be implemented in a gate first process, a gate last process, and a hybrid process including a gate first process and gate last process to form devices having a high-k gate dielectric and metal gate configuration.

What is claimed is:

1. A method of fabricating a semiconductor device comprising:
providing a substrate including GaAs and free of indium;
forming an interfacial layer comprising $GaS_x$ or $AsS_x$ on the substrate by treating the substrate with sulfur and hydrogen radicals generated by an ultraviolet process at a temperature equal to or less than 500 degree C., wherein the sulfur and hydrogen radicals reacts with the substrate in a gaseous phase, wherein sulfhydryl function groups ($—SH_x$) are bonded to a top surface of the interfacial layer during the forming of the interfacial layer; and
forming a high-k dielectric layer on the interfacial layer, wherein the sulfhydryl function groups ($—SH_x$) provide wetting function between the interfacial layer and the high-k dielectric layer.

2. The method of claim 1, wherein the UV process includes a temperature less than about 500 degree C., a total pressure ranging from 0.005 to about 10 Torr, a wavelength less than about 200 nm, and a time period less than about 1 minute.

3. The method of claim 1, wherein the sulfur and hydrogen radicals are generated from a gas selected from the group consisting of $H_2S$, $(NH_4)_2S$, $NH_3$, Ar, He, and combinations thereof.

4. The method of claim 3, wherein the sulfur and hydrogen radicals are generated with $NH_3$/Ar gas mixture with a $NH_3$ flow rate less than about 500 sccm.

5. The method of claim 3, wherein the sulfur and hydrogen radicals are generated with a $H_2S$/He gas mixture with a $H_2S$ partial pressure less than 0.1 Torr.

6. The method of claim 1, wherein the forming the high-k dielectric layer is by atomic layer deposition (ALD) or metal-organic chemical vapor deposition (MOCVD).

7. The method of claim 1, wherein the forming the interfacial layer and the forming the high-k dielectric layer are performed in-situ.

8. The method of claim 1, wherein the substrate includes germanium.

9. The method of claim 8, wherein the substrate includes a strained epitaxial layer.

10. A method comprising:
providing a substrate including GaAs and free of indium;
forming an interfacial layer containing sulfur on the substrate by applying sulfur radicals to the substrate, which includes forming a wetting agent on a top surface of the interfacial layer, the wetting agent having sulfhydryl function groups, wherein the sulfur radicals are applied to the substrate in a gaseous phase; and
forming a high-k dielectric layer on the wetting agent and the interfacial layer, wherein the forming of the interfacial layer and the forming of the high-k dielectric layer are performed in-situ.

11. The method of claim 10, wherein forming the interfacial layer containing sulfur includes generating the sulfur radicals by a plasma process or an ultraviolet (UV) process.

12. The method of claim 10, wherein the sulfur radicals are generated from $H_2S$.

13. The method of claim 12, wherein the interfacial layer includes at least one of $GaS_x$ and $AsS_x$.

14. The method of claim 10, wherein the substrate is without any interfacial layer prior to the applying of the sulfur radicals to the substrate.

15. The method of claim 10, wherein the substrate includes a strained epitaxial layer prior to the applying of the sulfur radicals to the substrate.

16. A method comprising:
providing a substrate including GaAs and free of indium;
forming an interfacial layer containing $GaS_x$ and $AsS_x$ on the substrate by applying sulfur radicals to the substrate at a temperature equal to or less than 500 degree C., wherein the sulfur radicals are generated from a gas mixture of $NH_3$, $H_2S$ and Ar wherein sulfhydryl function groups ($—SH_x$) are bonded to a top surface of the interfacial layer during the forming of the interfacial layer, wherein the interfacial layer physically contacts the substrate; and
forming a high-k dielectric layer containing hafnium on the interfacial layer, wherein the sulfhydryl function groups provide wetting function between the interfacial layer and the high-k dielectric layer, wherein the forming of the interfacial layer and the forming of the high-k dielectric layer are performed in-situ.

17. The method of claim 16, forming the interfacial layer sulfur includes generating the sulfur radicals by a plasma process or an ultraviolet (UV) process.

18. The method of claim 16, wherein the sulfur radicals are generated with a $H_2S$ partial pressure less than 0.1 Torr.

19. The method of claim 16, wherein the forming of the high-k dielectric layer is by atomic layer deposition (ALD) or metal-organic chemical vapor deposition (MOCVD).

20. The method of claim 16, wherein the sulfur radicals are free radicals in a gaseous phase.

* * * * *